(12) United States Patent
Kim

(10) Patent No.: US 9,557,475 B2
(45) Date of Patent: Jan. 31, 2017

(54) DISPLAY DEVICE

(71) Applicant: SAMSUNG DISPLAY CO., LTD., Yongin, Gyeonggi-Do (KR)

(72) Inventor: Dong Gyu Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 2 days.

(21) Appl. No.: 14/676,731

(22) Filed: Apr. 1, 2015

(65) Prior Publication Data

US 2016/0027378 A1    Jan. 28, 2016

(30) Foreign Application Priority Data

Jul. 25, 2014 (KR) .................. 10-2014-0094696

(51) Int. Cl.
| G09G 3/36 | (2006.01) |
|---|---|
| F21V 8/00 | (2006.01) |
| H01L 27/32 | (2006.01) |
| G09G 3/32 | (2016.01) |
| G02B 6/42 | (2006.01) |

(52) U.S. Cl.
CPC .......... *G02B 6/0088* (2013.01); *G02B 6/0053* (2013.01); *G02B 6/0055* (2013.01); *G09G 3/3233* (2013.01); *H01L 27/3227* (2013.01); *G02B 6/0036* (2013.01); *G02B 6/4286* (2013.01); *G09G 2320/029* (2013.01); *G09G 2320/045* (2013.01); *G09G 2320/048* (2013.01)

(58) Field of Classification Search
None
See application file for complete search history.

(56) References Cited

U.S. PATENT DOCUMENTS

| 9,059,337 B1* | 6/2015 | Robinson .......... H01L 33/0004 |
|---|---|---|
| 2008/0002128 A1 | 1/2008 | Park et al. |
| 2010/0102301 A1 | 4/2010 | Yang et al. |
| 2010/0253660 A1* | 10/2010 | Hashimoto ............... G01J 1/02 345/207 |
| 2012/0050344 A1 | 3/2012 | Kim et al. |

FOREIGN PATENT DOCUMENTS

| KR | 10-2008-0001764 A | 1/2008 |
|---|---|---|
| KR | 10-2009-0081481 A | 7/2009 |
| KR | 10-2010-0047456 A | 5/2010 |
| KR | 10-2012-0019016 A | 3/2012 |

\* cited by examiner

*Primary Examiner* — Joseph Haley
(74) *Attorney, Agent, or Firm* — Lewis Roca Rothgerber Christie LLP

(57) ABSTRACT

A display device includes: a first substrate; a pixel defining layer on the first substrate, the pixel defining layer being configured to define a pixel area; a pixel electrode in the pixel area; a light emission layer on the pixel electrode; a common electrode on the light emission layer; a second substrate facing the first substrate; an edge black matrix on one surface of the second substrate, the edge black matrix being configured to define a non-display area; a reflective layer on the edge black matrix; a light guide part on one surface of the first substrate; and a light sensor unit configured to receive light emitted from the light guide part.

17 Claims, 6 Drawing Sheets

DISPLAY DEVICE

CROSS-REFERENCE TO RELATED APPLICATION

This application claims priority to and the benefit of Korean Patent Application No. 10-2014-0094696, filed on Jul. 25, 2014, with the Korean Intellectual Property Office, the disclosure of which is incorporated herein in its entirety by reference.

BACKGROUND

1. Field

Embodiments of the present invention relate to a display device.

2. Description of the Related Art

In general, flat or otherwise thin panel displays (FPDs) such as liquid crystal displays and organic light emitting diode displays may include opposed electric field generating electrodes and an electro-optically active layer arranged to be affected by correspondingly generated electric fields. In the case of liquid crystal displays, a liquid crystal layer may be included as the electro-optically active layer, and in the case of organic light emitting diode displays, an organic light emitting layer may be included as the electro-optically active layer.

One of the opposed electric field generating electrodes may be coupled to a switching element so that it receives an electrical signal on a selective basis. The electro-optically active layer may convert the received electrical signal to a corresponding optical signal, thereby displaying an image.

Among flat panel displays, organic light emitting diode displays are self-emissive. In some displays, brightness may be slightly reduced depending on viewing angles. However, as the amount of time that an organic light emitting diode display is used increases, brightness becomes lower, and thus image sticking may occur. Display devices may include externally installed light sensors to the detect brightness of organic light emitting diodes and when the brightness appears to be lowered, the light sensor may facilitate compensation for brightness loss. However, when the light sensor is attached to an exterior of a display device, the location of the light sensor should vary depending on whether the display device is a top emission or a bottom emission display device.

It is to be understood that this background of the technology section is intended to provide useful background for understanding the here disclosed technology and as such, the technology described in the background section may include ideas, concepts, or recognitions that were not part of what was known or appreciated by those skilled in the pertinent art prior to corresponding effective filing dates of subject matter disclosed herein.

SUMMARY

Aspects of embodiments of the present invention include a display device in which a reflective layer is arranged above a dummy pixel area and a light guide component is arranged under the dummy pixel area, thereby detecting brightness.

According to some embodiments, a display device includes: a first substrate, a pixel defining layer disposed on the first substrate and configured to define a pixel area, a pixel electrode in the pixel area, a light emission layer on the pixel electrode, a common electrode on the light emission layer, a second substrate facing the first substrate, an edge black matrix disposed on one surface of the second substrate and configured to define a non-display area, a reflective layer on the edge black matrix, a light guide part on one surface of the first substrate, and a light sensor unit configured to receive light emitted from the light guide part.

At least part of the pixel area may overlap the edge black matrix.

The light guide part may include a light guide plate and a light guide reflective plate on one surface of the light guide plate.

The light guide plate may be at the edge black matrix.

The display device may further include a prism part between the light guide plate and the first substrate.

The prism part may overlap the edge black matrix.

The prism part may overlap the light guide part.

The light guide plate may face a peak of the prism part.

The reflective layer may overlap the light guide part.

The reflective layer may be at the pixel area overlapping the edge black matrix.

The non-display area may include a pixel that has a same structure as a pixel of a display area.

The light guide part may have a polygonal or U-shaped cross-section.

The light sensor unit may be configured to measure a luminance value of a pixel disposed in the pixel area overlapping the edge black matrix.

The display device may further include a compensation image data generator configured to calculate a compensation amount according to an accumulated time of light emission of a first organic light emitting diode at the pixel area overlapping the edge black matrix utilizing the measured luminance value, to detect the compensation amount corresponding to an accumulated time of light emission of a second organic light emitting diode at the display area, and to compensate for image data of the second organic light emitting diode according to the detected compensation amount.

The compensation image data generator may include a memory configured to store an initially set luminance value, a timer configured to measure the accumulated time of light emission of the first organic light emitting diode, a data aggregation part configured to accumulate and aggregate the image data corresponding to the second organic light emitting diode disposed in the display area, a compensation amount calculation part configured to calculate a compensation amount of the image data corresponding to the second organic light emitting diode according to an accumulated time of light emission utilizing the measured luminance value, the initially set luminance value, and the accumulated time of light emission of the first organic light emitting diode, and an image data compensation part configured to detect the accumulated time of light emission of the second organic light emitting diode, and to modulate the image data of the second organic light emitting diode to the compensation amount corresponding to the detected accumulated time of light emission.

The compensation amount calculation part may be configured to calculate a reduction amount of luminance using the measured luminance value and the initially set luminance value and to calculate an increased amount of an accumulated time of light emission corresponding to the calculated reduction amount of luminance to the compensation amount.

The compensation image data generator may further include a lookup table in which the compensation amount calculated by the compensation amount calculation part is stored according to the accumulated time of light emission of the first organic light emitting diode.

According to embodiments of the present invention, a display device may be capable of detecting luminance of a dummy pixel regardless of whether the display device is a top or bottom emission display device, of obtaining an amount of light enough to detect the luminance of a dummy pixel by including a reflective layer on the dummy pixel, and of compensating for degradation of a pixel using the detected luminance.

The description herein is illustrative only and is not intended to be limiting. In addition to the illustrative aspects, embodiments, and features described above, further aspects, embodiments, and features will become apparent by reference to the drawings and the following detailed description.

BRIEF DESCRIPTION OF THE DRAWINGS

Some features of the present invention will become more apparent to those of skill in the art by describing in more detail example embodiments with reference to the attached drawings in which.

DETAILED DESCRIPTION

Figure 1:
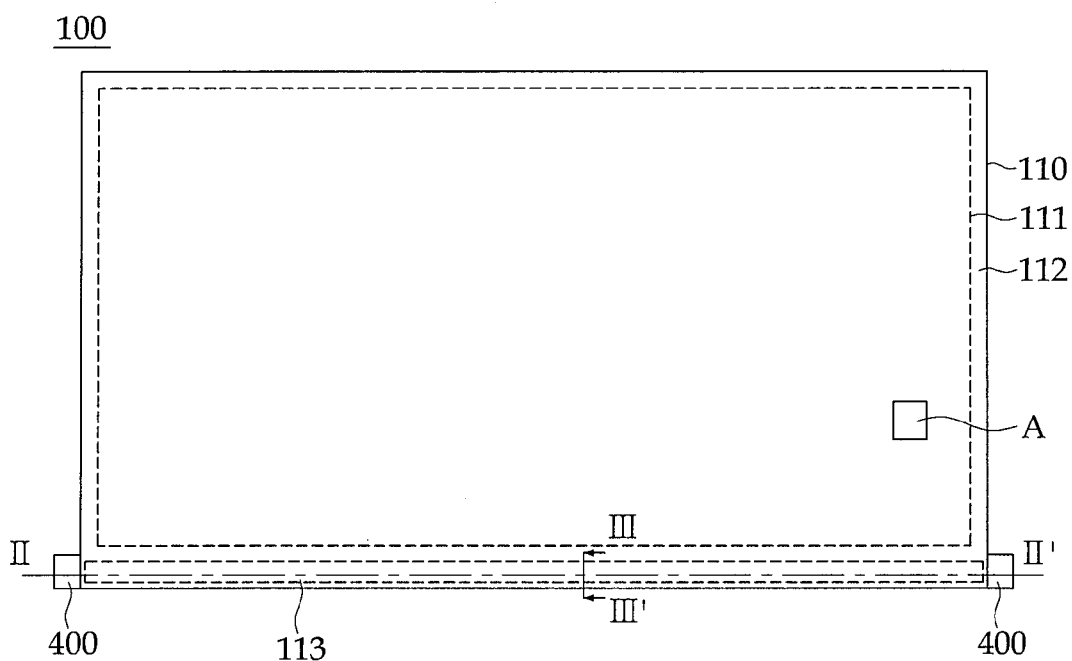
FIG. 1 is a schematic plan view illustrating a display device according to an embodiment of the present invention.

Aspects and features of the present invention and methods for achieving them will be made clear from embodiments described below in detail with reference to the accompanying drawings. The present invention may, however, be embodied in many different forms and should not be construed as limited to the embodiments set forth herein. Rather, these embodiments are provided so that this disclosure will be more thorough and complete, and will more fully convey the scope of the invention to those skilled in the art. This invention will be defined only by the scope of the claims. Therefore, well-known constituent elements, operations, and techniques are not described in detail in the embodiments, to prevent the present invention from being obscurely interpreted. Like reference numerals refer to like elements throughout the specification.

Spatially relative terms, such as "below," "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "lower" relative to other elements or features would then be oriented "above" or "upper" relative to the other elements or features. Thus, the example term "below" can encompass both an orientation of above and below. The device may be otherwise oriented (rotated 90 degrees or at other orientations) and the spatially relative descriptors used herein interpreted accordingly.

The terminology used in this specification is merely used to describe embodiments of the present invention and is not intended to limit the invention. An expression used in the singular encompasses the expression of the plural unless it has a clearly different meaning in the context. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present application.

Hereinafter, a display device according to an embodiment will be fully described with reference to FIGS. 1 to 5. According to an embodiment, the display device may be an organic light emitting diode (OLED) display or a liquid crystal display (LCD). Hereinafter, the OLED display will be used as an example of the display device.

Figure 2:
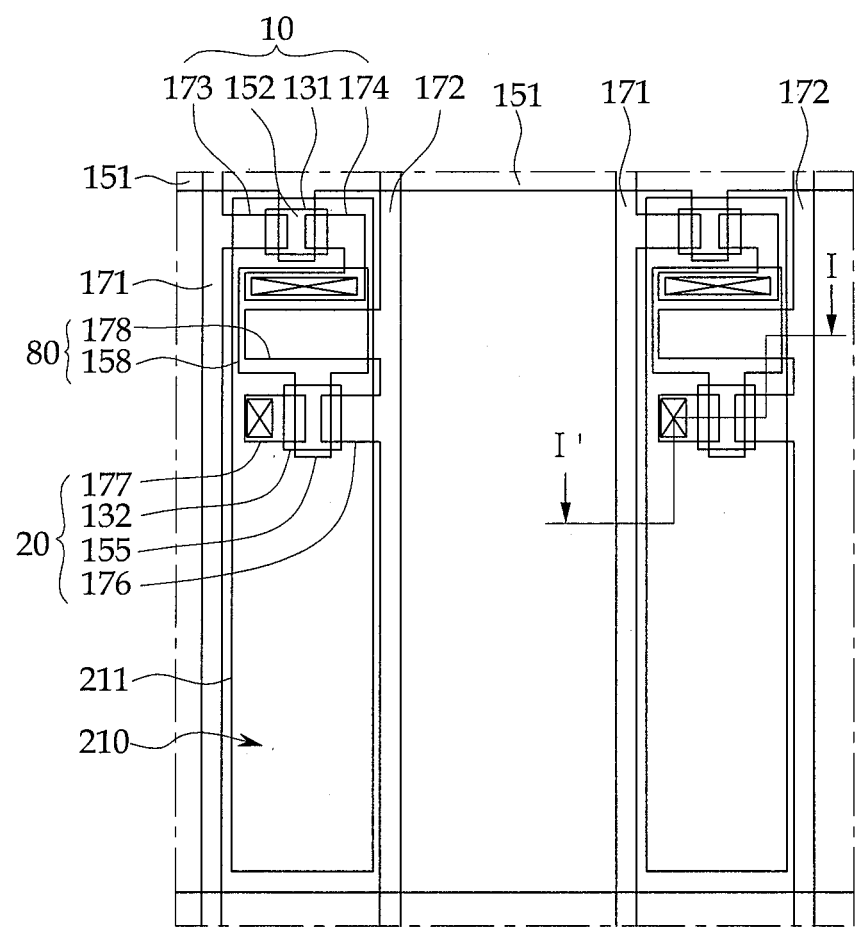
FIG. 2 is an enlarged view of the area A of FIG. 1.
Figure 3:
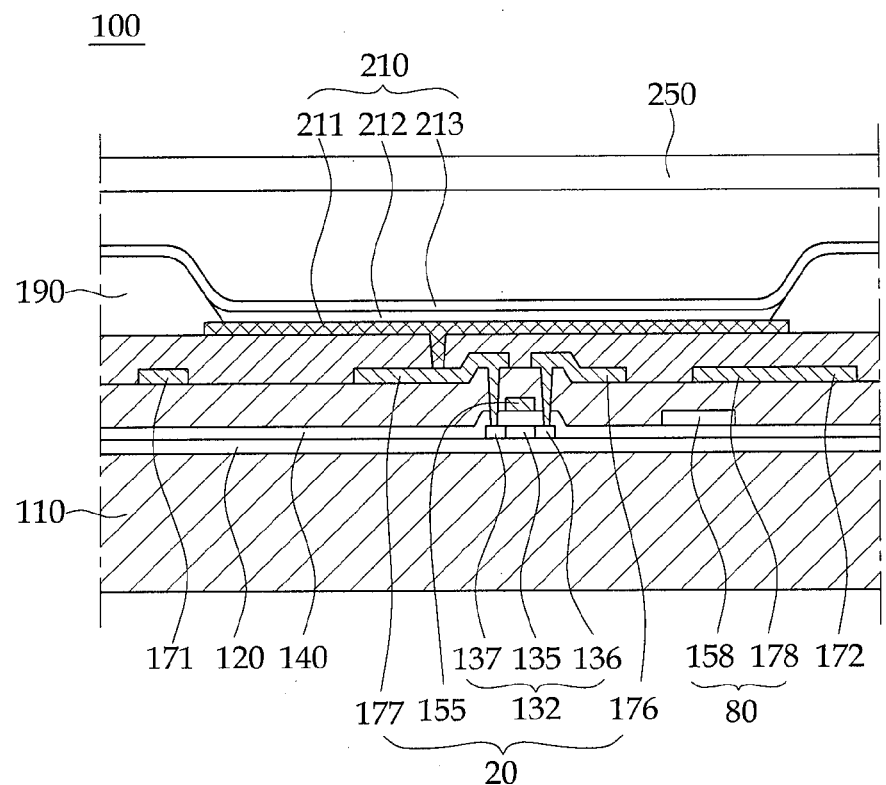
FIG. 3 is a cross-sectional view taken along the line I-I' of FIG. 2.
Figure 4:
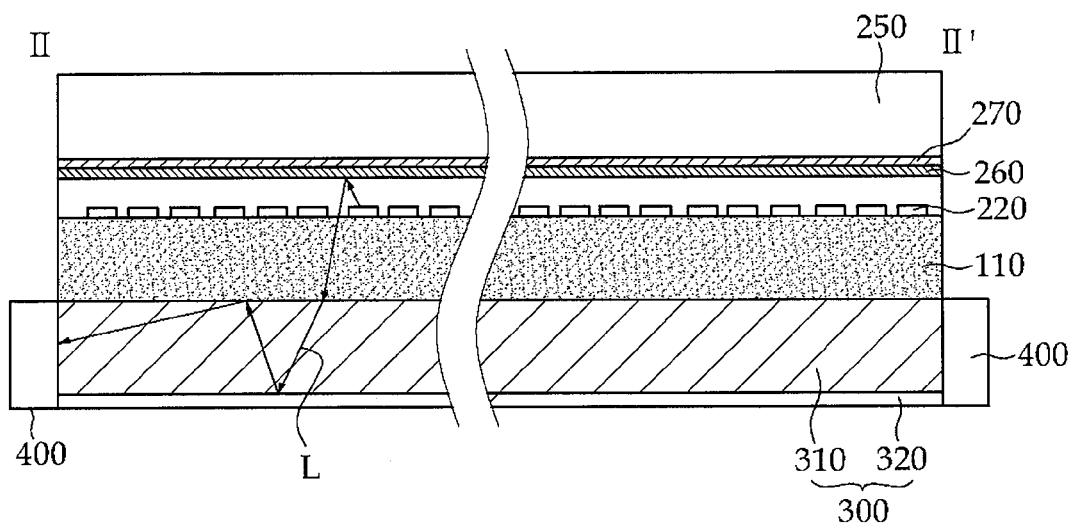
FIG. 4 is a cross-sectional view taken along the line II-II' of FIG. 1.
Figure 5:
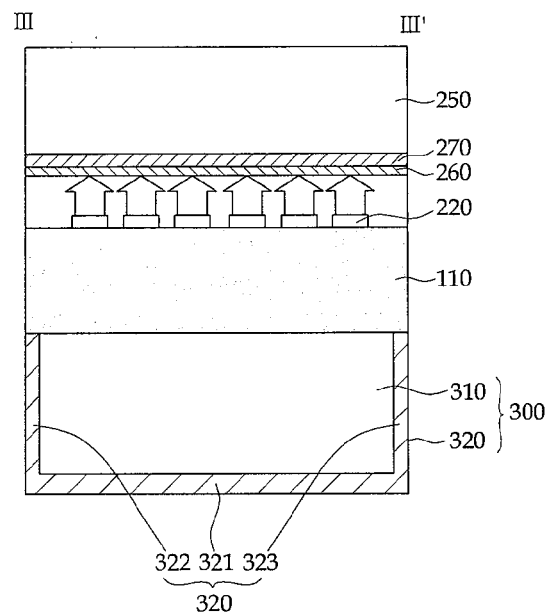
FIG. 5 is a cross-sectional view taken along the line III-III' of FIG. 1.

FIG. 1 is a schematic plan view showing a display device according to an embodiment of the present invention. FIG. 2 is an enlarged view of area A of FIG. 1. FIG. 3 is a cross-sectional view taken along the line I-I' of FIG. 2. FIG. 4 is a cross-sectional view taken along the line II-II' of FIG. 1. FIG. 5 is a cross-sectional view taken along line the III-III' of FIG. 1.

Referring to FIGS. 1 and 5, the OLED display 100 may include a first substrate 110 including a display area 111 and a non-display area 112, a pixel defining layer (PDL) 190 located on the first substrate 110 and configured to define a pixel area, a pixel electrode 211 in the pixel area, a light emission layer 212 on the pixel electrode 211, a common electrode 213 on the light emission layer 212, a second substrate 250 facing the first substrate 110, an edge black matrix 270 located on one surface of the second substrate 250 and configured to define the non-display area 112, a reflective layer 260 on the edge black matrix 270, a light guide part 300 on one surface of the first substrate 110, and a light sensor unit 400 configured to receive light emitted from the light guide part 300.

Referring to FIG. 1, the OLED display 100 may include the first substrate 110 including the display area 111 and the non-display area 112.

A plurality of pixels may be arranged in the display area 111 of the first substrate 110 so as to display an image.

As illustrated in FIGS. 4 and 5, the edge black matrix 270 may be located in the non-display area 112. That is, the edge black matrix 270 may be positioned on one surface of the second substrate 250 so as to define the non-display area 112. A dummy pixel unit 113 may be arranged in the non-display area 112. The dummy pixel unit 113 may arranged to overlap the light guide part 300 and the reflective layer 260 which will be described below with reference to FIGS. 4 and 5.

An organic light emitting diode (OLED) 210 serving as a display device and thin film transistors (TFTs) 10 and 20 configured to drive the OLED 210 may be arranged in the display area 111.

Referring to FIGS. 2 and 3, the OLED display 100 may be arranged in the display area 111 and may include a plurality of pixels including a switching TFT 10, a driving TFT 20, a capacitor 80, and the OLED 210. In this embodiment, the pixel may be the smallest unit that displays an image. The OLED display 100 may display an image utilizing a plurality of pixels.

FIG. 2 illustrates an example of an OLED display, which has a 2Tr-1Cap (two transistors-one capacitor) structure having two TFTs 10 and 20 and one capacitor 80 in one pixel. However, embodiments of the present invention are not limited to the structure. In another implementation, the OLED display may have three or more TFTs and/or two or more capacitors in one pixel, or may have various structures by further forming separate conductive lines.

The OLED display 100 may include a gate line 151 on the substrate 110, and a data line 171 and a power line 172 that are insulated from and cross (e.g., intersect or overlap) the gate line 151. Each pixel may be generally defined by the gate line 151, the data line 171, and the power line 172 as a boundary, but embodiments of the present invention are not limited thereto. The pixel may also be defined by a black matrix or pixel defining layer (PDL).

The first substrate 110 may be an insulating substrate including, for example, glass, quartz, ceramic, plastic, etc., but embodiments of the present invention are not limited thereto. The first substrate 110 may also be a metal substrate made of stainless steel, etc.

A buffer layer 120 may be arranged on the first substrate 110. The buffer layer 120 may prevent or reduce infiltration of undesirable elements such as impurities and moisture and may provide a planar surface. The buffer layer 120 may be made of a suitable material for planarizing and/or preventing infiltration. For example, the buffer layer 120 may include one or more of silicon nitride ($SiN_x$), silicon oxide ($SiO_2$), or silicon oxynitride ($SiO_xN_y$). In an implementation, the buffer layer 120 may be omitted depending on kinds and process conditions of the first substrate 110.

Switching and driving semiconductor layers 131 and 132 may be arranged or formed on the buffer layer 120. The switching and driving semiconductor layers 131 and 132 may be made of one or more of, e.g., polycrystalline silicon, amorphous silicon, or an oxide semiconductor such as IGZO (Indium Gallium Zinc Oxide) and IZTO (Indium Zinc Tin Oxide). In the case of the driving semiconductor layer 132 illustrated in FIG. 3, including polycrystalline silicon, the driving semiconductor layer 132 may include a channel area 135 that is not doped with impurities, and p+ doped source and drain areas 136 and 137 on the respective sides of the channel area 135. In this case, p-type impurities such as boron B may be used as dopant ions. For example, $B_2H_6$ may be used. Such impurities may vary depending on kinds of the TFTs. According to an embodiment of the present invention, a PMOS-structured TFT using the p-type impurities is used as the driving TFT 20, but embodiments of the present invention are not limited thereto. An NMOS-structured or CMOS-structured TFT may also be used as the driving TFT 20.

A gate insulating layer 140 may be arranged on the switching and driving semiconductor layers 131 and 132. The gate insulating layer 140 may include at least one of, for example, tetraethyl orthosilicate (TEOS), silicon nitride ($SiN_x$), and silicon oxide ($SiO_2$). In an implementation, the gate insulating layer 140 may have a double layer structure in which a silicon nitride layer having a thickness of about 40 nm and a TEOS layer having a thickness of about 80 nm are sequentially laminated.

A gate wire that includes gate electrodes 152 and 155 may be arranged on the gate insulating layer 140. The gate wire may further include the gate line 151, a first capacitor plate 158, and other wires. The gate electrodes 152 and 155 may be disposed to overlap at least part of the semiconductor layers 131 and 132, e.g., to overlap the channel area 135. The gate electrodes 152 and 155 may prevent the channel area 135 from being doped with impurities when the source and drain areas 136 and 137 of the semiconductor layers 131 and 132 are doped with the impurities in the process of forming the semiconductor layers 131 and 132.

The gate electrodes 152 and 155 and the first capacitor plate 158 may be arranged on the same layer and may be made of substantially the same metal material. The gate electrodes 152 and 155 and the first capacitor plate 158 may include at least one selected from molybdenum (Mo), chromium (Cr), and tungsten (W).

An interlayer insulating layer 160 configured to cover the gate electrodes 152 and 155 may be arranged on the gate insulating layer 140. The interlayer insulating layer 160 may be made of tetraethyl orthosilicate (TEOS), silicon nitride ($SiN_x$), or silicon oxide ($SiO_x$) similar to the gate insulating layer 140, but embodiments of the present invention are not limited thereto.

A data wire including source electrodes 173 and 176 and drain electrodes 174 and 177 may be arranged on the interlayer insulating layer 160. The data wire may further include the data line 171, the power line 172, a second capacitor plate 178, and other wires. The source electrodes 173 and 176 and the drain electrodes 174 and 177 may be respectively coupled to the source area 136 and the drain area 137 of the semiconductor layers 131 and 132 through a contact opening (e.g., hole) formed in the gate insulating layer 140 and the interlayer insulating layer 160.

Thus, the switching TFT 10 may include the switching semiconductor layer 131, the switching gate electrode 152, the switching source electrode 173, and the switching drain electrode 174, and the driving TFT 20 may include the driving semiconductor layer 132, the driving gate electrode 155, the driving source electrode 176, and the driving drain electrode 177. The configurations of the TFTs 10 and 20 are not limited to the above-described embodiment and may vary according to other configurations understood by those of ordinary skill in the art.

The capacitor 80 may include the first capacitor plate 158 and the second capacitor plate 178 with the interlayer insulating layer 160 interposed therebetween.

The switching TFT 10 may function as a switching device that selects a pixel to perform light emission. The switching gate electrode 152 may be coupled to the gate line 151. The switching source electrode 173 may be coupled to the data line 171. The switching drain electrode 174 may be spaced apart from the switching source electrode 173 and may be coupled to the first capacitor plate 158.

The driving TFT 20 may apply a driving power to the pixel electrode 211 to enable the light emission layer 212 of the OLED 210 in a selected pixel to emit light. The driving gate electrode 155 may be coupled to the first capacitor plate 158. The driving source electrode 176 and the second capacitor plate 178 may be coupled to the power line 172.

The driving drain electrode 177 may be coupled to the pixel electrode 211 of the OLED 210 through a contact hole.

The switching TFT 10 may be operated by a gate voltage applied to the gate line 151, and may function to transmit a data voltage applied to the data line 171 to the driving TFT 20. A voltage equivalent to a differential between a common voltage applied to the driving TFT 20 from the power line 172 and the data voltage transmitted from the switching TFT 10 may be stored in the capacitor 80, and a current that corresponds to the voltage stored in the capacitor 80 may flow to the OLED 210 through the driving TFT 20 so that the OLED 210 may emit light.

The source electrodes 173 and 176 and the drain electrodes 174 and 177 may be made of a metal or electrically conductive material. Examples of the metal may include molybdenum (Mo), chromium (Cr), tungsten (W), aluminum (Al), and copper (Cu), and the metals may be used alone or in combination with each other. Further, the source electrodes 173 and 176 and the drain electrodes 174 and 177 may have a single layer or multilayer structure.

A planarization layer 180 may be disposed on the interlayer insulating layer 160 and may be configured to cover the data wire patterned on the same layer as the data line 171, the power line 172, the source electrodes 173 and 176, the drain electrodes 174 and 177, and the second capacitor plate 178. The planarization layer 180 may serve to planarize a surface of the OLED 210 that is disposed on the planarization layer 180 by eliminating or reducing steps so as to increase light emission efficiency of the OLED 210.

The planarization layer 180 may be made of at least one selected from a polyacrylate resin, an epoxy resin, a phenolic resin, a polyamide resin, a polyimide resin, an unsaturated polyester resin, a polyphenylenether resin, a polyphenylene sulfide resin, and benzocyclobutene (BCB).

The pixel electrode 211 of the OLED 210 may be disposed on the planarization layer 180. The pixel electrode 211 may be coupled to the drain electrode 177 through a contact opening of the planarization layer 180.

The pixel electrode 211 may be any one of a transmissive electrode, a transflective electrode, and a reflective electrode.

A transparent conductive oxide (TCO) may be used to form the transmissive electrode. The TCO may include at least one selected from ITO (Indium Tin Oxide), IZO (Indium Zinc Oxide), ZnO (zinc oxide), and $In_2O_3$(Indium Oxide).

A metal such as magnesium (Mg), silver (Ag), gold (Au), calcium (Ca), lithium (Li), chromium (Cr), aluminum (Al), and copper (Cu), or alloys thereof may be used to form the transflective electrode and the reflective electrode. In this case, the transflective electrode and the reflective electrode may have different thicknesses. For example, the transflective electrode may have a thickness of about 200 nm or less and the reflective electrode may have a thickness of about 300 nm or greater. As the thickness of the transflective electrode decreases, both light transmittance and resistance may increase. Conversely, as the thickness of the transflective electrode increases, light transmittance may decrease.

The transflective electrode and the reflective electrode may have a multilayer structure that includes a metal layer made of a metal or an alloy thereof and a transparent conductive oxide (TCO) layer laminated on the metal layer.

According to kinds of materials included in the pixel electrode 211 and the common electrode 213, the OLED display 100 may be classified into three types: a top emission type, a bottom emission type, and a dual-side emission type. According to one embodiment, the OLED display 100 may be a top emission device. That is, the OLED 210 may emit light in a direction of the common electrode 213 so as to display an image. In such a case, the pixel electrode 211 may be the reflective electrode, thereby improving light emission efficiency of the top emission OLED display 100. Examples of the reflective electrode may include an electrode having a structure in which a transparent conductive oxide layer made of ITO is laminated on a metal layer made of silver (Ag). The reflective electrode may also have a triple-layered structure in which silver (Ag), ITO, and silver (Ag) are sequentially laminated.

A pixel defining layer (PDL) 190 may be arranged on the planarization layer 180 so as to define a pixel area by exposing at least part of the pixel electrode 211. The pixel electrode 211 may be positioned to correspond to the pixel area of the PDL 190.

The PDL 190 may be made of a polyacrylate resin, a polyimide resin, or the like.

The light emission layer 212 may be arranged on the pixel electrode 211 in the pixel area and the common electrode 213 may be arranged on the PDL 190 and the light emission layer 212. The common electrode 213 may be in contact with a common electrode coupling part 231, and thus may be electrically coupled to a conductive line 230 for the common electrode 213.

The light emission layer 212 may include a low molecular weight organic material or a high molecular weight organic material. At least one of a hole injection layer (HIL) and a hole transport layer (HTL) may be arranged between the pixel electrode 211 and the light emission layer 212, and at least one of an electron transport layer (ETL) and an electron injection layer (EIL) may be arranged between the light emission layer 212 and the common electrode 213.

The common electrode 230 may be made of a transflective (translucent) layer. The transflective (translucent) layer used as the common electrode 230 may be made of at least one metal including magnesium (Mg), silver (Ag), calcium (Ca), lithium (Li), chromium (Cr), aluminum (Al) and copper (Cu). The common electrode 230 may have a multilayer structure including a metal layer including at least one of magnesium (Mg), silver (Ag), calcium (Ca), lithium (Li), chromium (Cr), aluminum (Al) and copper (Cu), and a transparent conductive oxide (TCO) layer laminated on the metal layer.

As described above, the OLED 210 may include the pixel electrode 211, the light emission layer 212 on the pixel electrode 211, and the common electrode 213 on the light emission layer 212. Herein, the pixel electrode 211 may serve as an anode, which may be a hole injection electrode, and the common electrode 213 may serve as a cathode, which may be an electron injection electrode. However, embodiments of the present invention are not limited thereto, and thus, the pixel electrode 211 may be a cathode, and the common electrode 213 may be an anode according to a driving method of the OLED display 100.

The second substrate 250 may be arranged to face the first substrate 110 so as to cover the TFT 20 and the OLED 210. The second substrate 250 may be a transparent insulating substrate made of glass or plastic. Further, a thin film encapsulation layer including organic and inorganic layers that are alternately laminated may be arranged on the OLED 210. In this case, the second substrate 250 may be omitted.

Referring to FIGS. 4 and 5, the OLED display 100 according to an embodiment may include the light guide part 300, the light sensor unit 400, a dummy pixel 220, and the reflective layer 260.

An light sensor is arranged on the first substrate 110 of a display device and detects luminance of the display device. In the case of a bottom emission display device, the first substrate 110 is applied as a light guide plate and the light sensor can detect light. On the other hand, in the case of a top emission display device, light incident on the second substrate 250 is absorbed into a black matrix or a color filter. Therefore, the top emission display device is not suitable to use a light sensing method that applies a substrate as a light guide plate as in the bottom emission display device.

A display device according to an embodiment may have a light sensing structure that can apply both the bottom emission device and the top emission device.

Referring to FIGS. 1 and 4, the dummy pixel unit 113 of the first substrate 110 may include the dummy pixel 220. The dummy pixel unit 113 may be an area where at least part of a pixel area overlaps the edge black matrix 270.

The dummy pixel 220 may have the same structure as a pixel disposed in the display area 111. The dummy pixel 220 may be driven by a TFT like the pixel disposed in the display area 111 so as to enable the OLED to emit light. That is, the dummy pixel 220 may be formed by the same process as the pixel disposed in the display area 111 and may overlap the non-display area 112 defined by the edge black matrix 270.

Accordingly, a pixel of the non-display area 112 may have substantially the same structure as the pixel of the display area 111.

Meanwhile, the dummy pixel 220 may be arranged in the non-display area 112 to perform light sensing in a top emission display device. That is, the reflective layer 260 may be arranged on the dummy pixel 220 so that a structure allowing light to be directed towards the light guide part 300 may be applied, and thus the OLED 210 arranged in the display area 110 may not be used.

The edge black matrix 270 may be arranged on one surface of the second substrate 250 so as to define the non-display area 112 and may also be arranged on the dummy pixel 220.

The reflective layer 260 may be arranged on the edge black matrix 270 and may also be arranged on the dummy pixel 220. That is, the reflective layer 260 may be arranged in the pixel area that overlaps the edge black matrix 270.

The reflective layer 260 may reflect light emitted from the dummy pixel 220 to the light guide part 300. The reflective layer 260 may be made of, for example, polyethylene terephthalate (PET), which imparts reflective properties, and one surface of the reflective layer 260 may be coated with a diffusion layer containing, for example, titanium dioxide.

The reflective layer 260 may also be made of a material containing a metal such as silver (Ag).

The light guide part 300 may be arranged on one surface of the first substrate 110. The light guide part 300 may include a light guide plate 310 and a light guide reflective plate 320. The light guide part 300 may have a polygonal or U-shaped cross-section.

The light guide plate 310 may receive light reflected by the reflective layer 260 and may emit the incident light to the light sensor unit 400. The light guide plate 310 may provide the light sensor unit 400 with light supplied from the dummy pixel 220. The light guide plate 310 may be shaped like a line or bar that is similar to the shape of the dummy pixel unit 113 in the non-display area 112 of a display device, but embodiments of the present invention are not limited thereto. The light guide plate 310 may be variously shaped to have an area corresponding to the non-display area 112.

The light guide plate 310 is described as a plate for ease of description, but it may also be provided in the form of a sheet or film to achieve slimness of a display device. That is, the light guide plate 310 may include not only a plate but also a film for guiding light.

The light guide plate 310 may be made of a light-transmissive material, e.g., an acrylic resin such as polymethylmethacrylate (PMMA) or polycarbonate (PC), so as to guide light efficiently.

The light guide reflective plate 320 may include the bottom portion 321 and the side portion 322, 323. The light guide reflective plate 320 may be arranged on one surface of the light guide plate 310. As illustrated in FIGS. 4 and 5, the light guide reflective plate 320 may be arranged on a bottom surface and a side surface of the light guide plate 310. That is, the light guide reflective plate 320 may be arranged on a surface of the light guide plate 310 except for a surface on which light emitted from the dummy pixel 220 is incident and a surface on which the light sensor unit 400 is arranged. The light guide reflective plate 320 may be arranged as illustrated in FIGS. 4 and 5 so that light incident on the light guide plate 310 may not be emitted outside the light guide plate 310 but may be collimated in the light sensor unit 400. The light guide reflective plate 320 may be made of the same material as the reflective layer 260.

The light sensor unit 400 may receive light emitted from the light guide part 300. In one embodiment, two light sensor units 400 may be arranged on the two sides of the light guide part 300. The light sensor unit 400 may convert analog values of measured light to digital values and may aggregate the digital values, and also may calculate luminance values using arithmetic operations.

The light sensor unit 400 may include a light sensor. The light sensor may be a small size and low cost device that is selected to fully perform its roles or functions. In one embodiment, a photoconductive cell (Cds), a photodiode, a phototransistor, a photo-thyristor, a charge-coupled device (CCD), or a complementary metal-oxide-semiconductor (CMOS) may be applied to the light sensor.

As described above, the top emission display device may also detect light efficiently utilizing the dummy pixel 220, the reflective layer 260, the light guide part 300, and the light sensor unit 400 so that luminance values can be calculated.

Hereinafter, a light guide part 300 according to another embodiment will be described with reference to FIG. 6.

Figure 6:
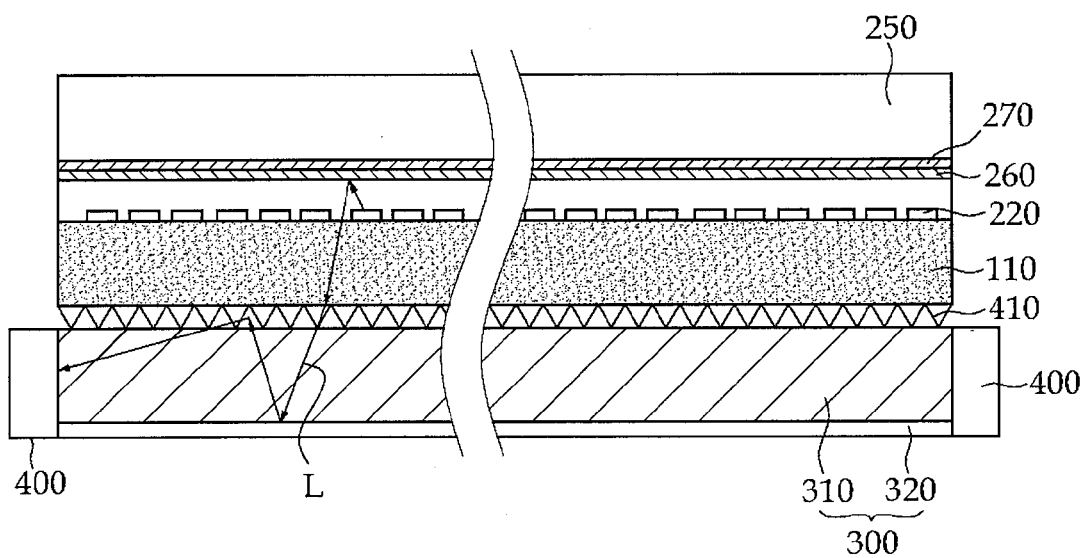
FIG. 6 is a cross-sectional view taken along the line II-II' of FIG. 1, according to another embodiment.

FIG. 6 is a cross-sectional view taken along the line II-II' of FIG. 1, according to another embodiment.

A display device according to another embodiment may further include a prism part 410 between the light guide plate 310 and the first substrate 110.

The prism part 410 may overlap the edge black matrix 270 and may also overlap the light guide part 300.

The prism part 410 may have triangular prisms on one surface thereof in an arrangement (e.g., a predetermined arrangement) and may collimate light emitted from the dummy pixel of the first substrate 110 into the light guide part 300. In one embodiment, a peak (a sharp tip of the triangular prism) of the prism part 410 may face the light guide plate 310.

Hereinafter, a method of compensating for degradation of a pixel utilizing luminance values detected by the light sensor 400 will be described with reference to FIGS. 7 and 9.

Figure 7:
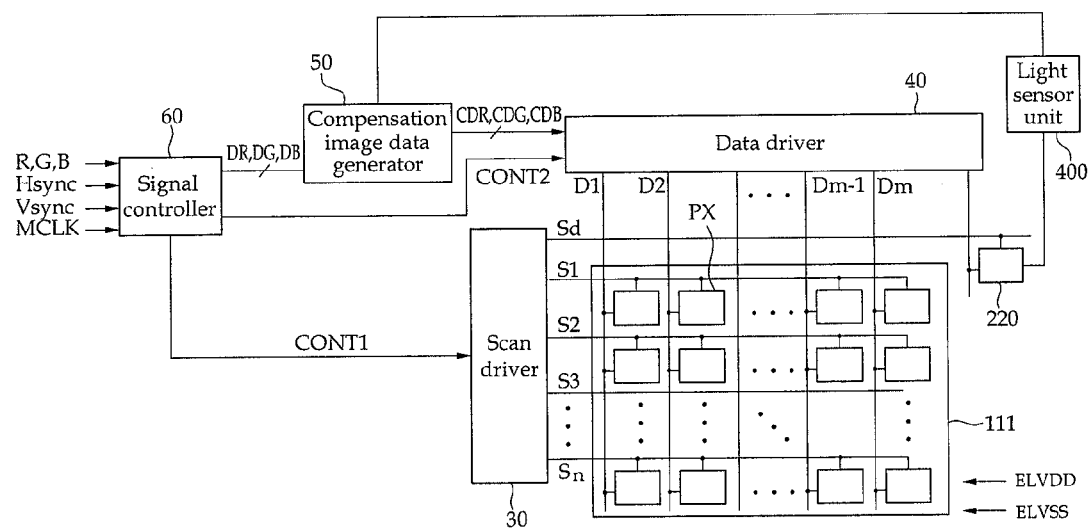
FIG. 7 is a schematic block diagram illustrating a display device according to an embodiment.
Figure 8:
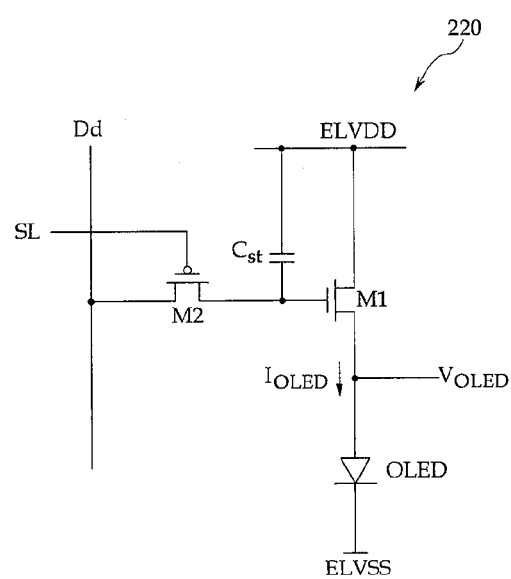
FIG. 8 is an equivalent circuit diagram of the dummy pixel illustrated in FIG. 7.

FIG. 7 is a schematic block diagram illustrating a display device according to an embodiment. FIG. 8 is an equivalent circuit diagram of a dummy pixel 220 illustrated in FIG. 7. FIG. 9 is a detailed block diagram showing a compensation image data generator illustrated in FIG. 7.

Referring to FIG. 7, a display device according to an embodiment may include the display area 111, the dummy pixel 220, a scan driver 30, a data driver 40, a signal controller 60, a compensation image data generator 50, and the light sensor unit 400. The display area 111 may include a plurality of signal lines S1~Sn and D1~Dm and a plurality of pixels PX coupled to the signal lines S1~Sn and D1~Dm and substantially arranged in a matrix form when seen from the equivalent circuit diagram.

The signal lines S1~Sn and D1~Dm may include a plurality of scan lines S1~Sn that transmit scan signals and a plurality of data lines D1~Dm that transmit data voltages. The scan lines S1~Sn may extend generally in a row direction so as to be substantially parallel to each other and the data lines D1~Dm may extend generally in a column direction so as to be substantially parallel to each other.

The dummy pixel 220 according to an embodiment may be coupled to a dummy scan line Sd and a dummy data line Dd. The dummy pixel 220 may be formed outside the display area 111 when the plurality of pixels PX is formed in the display area 111. The dummy pixel 220 may have the same characteristics as the plurality of pixels PX of the display area 111.

Referring to FIG. 8, the dummy pixel 220 may include an organic light emitting element (OLED), a driving transistor M1, a capacitor $C_{st}$, and a switching transistor M2.

A source terminal of the driving transistor M1 may receive a first driving voltage ELVDD and a drain terminal of the driving transistor M1 may be coupled to an anode terminal of the OLED. A gate terminal of the driving transistor M1 may be coupled to a drain terminal of the switching transistor M2. The driving transistor M1 may flow a driving current $I_{OLED}$ that varies in magnitude depending on the voltage applied between the gate terminal and the drain terminal to the OLED.

A gate terminal of the switching transistor M2 may be coupled to the dummy scan line Sd and a source terminal of the switching transistor M2 may be coupled to the dummy data line Dd. The switching transistor M2 may be switch-operated in accordance with a scan signal applied to the dummy scan line Sd and when the switching transistor M2 is turned on, a data signal applied to the dummy data line Dd, namely a data voltage, may be transmitted to the gate terminal of the driving transistor M1.

The capacitor $C_{st}$ may be coupled between the source and gate terminals of the driving transistor M1. The capacitor $C_{st}$ may charge the data voltage applied to the gate terminal of the driving transistor M1 and the charged data voltage may be maintained even after the switching transistor M2 is turned off.

The organic light emitting element (OLED) may be embodied as an organic light emitting diode. The OLED may receive a second driving voltage ELVSS utilizing a cathode terminal. The OLED may emit light of which intensity varies depending on the driving current $I_{OLED}$ supplied from the driving transistor M1. The OLED is generally degraded as driving time passes and a resistance value increases, and thus an amount of emitted light of the same current is reduced according to the degree of degradation.

A luminance may be used as a factor that represents the amount of light that is emitted from the OLED. The resistance of the OLED may increase with the degradation of the OLED and the luminance of the same current may be reduced.

An OLED display according to an embodiment may determine the degree of degradation of the OLED in accordance with the driving time utilizing luminance values of the dummy pixel 220, which are measured by the light sensor unit 400. In an analog driving method, the OLED display may compensate for the driving current $I_{OLED}$, which flows into the OLED according to image data (DR, DG, DB), to correspond to the degradation degree.

In a digital driving method, the OLED display may compensate for an emission time of the OLED according to image data (DR, DG, DB) to correspond to the degradation degree. Then, the OLED display may compensate for reduced luminance caused by the degradation of the OLED. The OLED display according to an embodiment may use the image data (DR, DG, DB) corresponding to each of the plurality of pixels PX so as to determine the degree of degradation of the OLED of each of the plurality of pixels PX and further descriptions thereof will be described in more detail below with reference to FIG. 9.

Meanwhile, the driving transistor M1 and the switching transistor M2 are shown as a p-channel field-effect transistor (FET) in FIG. 8, but embodiments of the present invention are not limited thereto. At least one of the driving transistor M1 and the switching transistor M2 may be an n-channel field-effect transistor (FET). Further, the connection relations of the driving transistor M1, the switching transistor M2, the capacitor $C_{st}$, and the OLED may change. The dummy pixel 220 shown in FIG. 8 is one example of one pixel of a display device, and a different type of pixel including at least two transistors and at least one capacitor may be adopted. The configuration of the pixel PX illustrated in FIG. 7 may be consistent with that of the dummy pixel 220 illustrated in FIG. 8, and thus descriptions of the same configuration will be omitted.

Referring back to FIG. 7, the scan driver 30 may be coupled to the scan lines S1~Sn of the display area 111 and may apply scan signals sequentially to the scan lines S1~Sn in accordance with scan control signals CONT1. The scan signals may include a gate-on voltage Von that turns on the switching transistor M2 and a gate-off voltage Voff that turns off the switching transistor M2. In the case where the switching transistor M2 is the p-channel field-effect transistor (FET), the gate-on voltage Von and the gate-off voltage Voff may be a low voltage and a high voltage, respectively.

Further, the scan driver 30 may be coupled to the dummy scan line Sd and may apply a dummy scan signal to the dummy scan line Sd. In this case, the dummy scan signal applied to the dummy scan line Sd may maintain a level of the gate-on voltage Von.

The data driver 40 may be connected to the data lines D1~Dm of the display area 111 and may convert compensation image data (CDR, CDG, CDB) input from the signal controller 60 in accordance with data control signals CONT2 to a data voltage and may apply the data voltage to the data lines D1~Dm. The data driver 40 may be driven by the digital driving method. In other words, the data driver 40 may adjust a pulse width of the data voltage so as to display a gray level the compensation image data (CDR, CDG, CDB). Further, the data driver 40 may be coupled to the dummy data line Dd of the dummy pixel 220 and may apply a dummy data voltage having a pulse width corresponding to a full white gray level to the dummy data line Dd.

The signal controller 60 may externally receive input signals (R, G, B), a horizontal synchronization signal Hsync, a vertical synchronization signal Vsync, and a main clock signal MCLK so as to generate the scan control signal CONT1, the data control signal CONT2, and the image data (DR, DG, DB). The scan control signal CONT1 may include a scanning start signal STV that instructs to start scanning and at least one clock signal that controls an output cycle of the gate-on voltage Von. The scan control signal CONT1 may further include an output enable signal OE that limits a duration time of the gate-on voltage Von.

The data control signal CON2 may include a horizontal synchronization start signal STH which notifies transmission of the compensation image data CDR, CDG, CDB for one row of pixels PX to the data driver 40, and a load signal LOAD which instructs to apply a plurality of data voltages to the data lines D1~Dm.

The light sensor unit 400 may receive light emitted from the dummy pixel 220 and may convert the light into digital values. The light sensor unit 400 may calculate the converted digital values using arithmetic operations so as to calculate luminance values of the dummy pixel 220. The light sensor unit 400 may transmit the calculated luminance values to the compensation image data generator 50.

Meanwhile, the OLED included in the dummy pixel 220 is called a first OLED and the OLED included in the plurality of pixels PX is called a second OLED for ease of description.

The compensation image data generator 50 may calculate a compensation amount in accordance with an accumulated time of light emission of the first OLED utilizing measured luminance values and an accumulated emission time of the dummy pixel 220, may determine the compensation amount in accordance with an accumulated emission time of each of the second OLEDs of the plurality of pixels PX, and may compensate for the image data DR, DG, DB, which corresponds to each of the second OLEDs of the plurality of pixels PX according to the determined compensation amount. The image data DR, DG, DB compensated by the compensation image data generator 50 may be called the compensation image data CDR, CDG, CDB.

The compensation image data generator 50 may determine the compensation amount corresponding to each point of time whenever the accumulated emission time increases by a compensation unit time.

Figure 9:
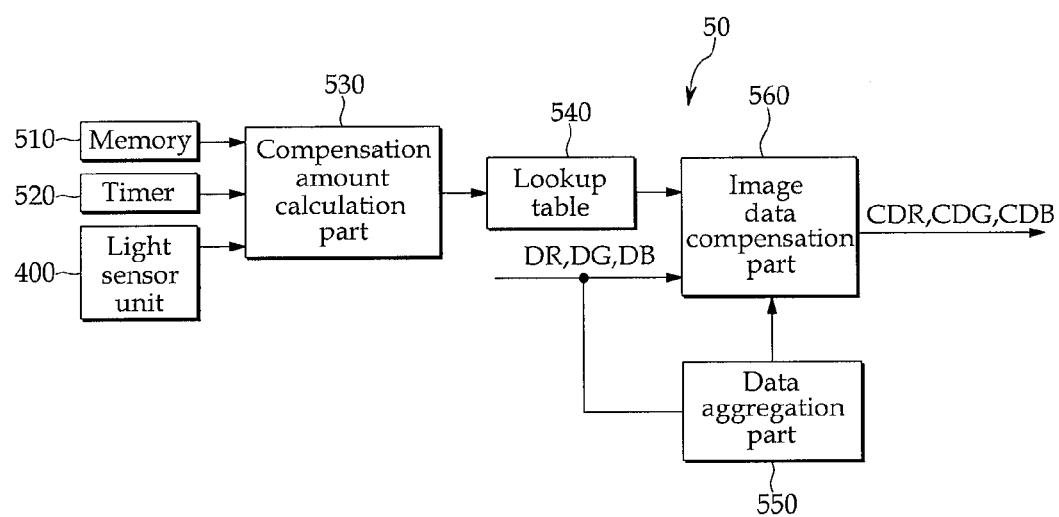
FIG. 9 is a detailed block diagram showing further details of the compensation image data generator illustrated in FIG. 7.

For example, the compensation image data generator 50, as illustrated in FIG. 9, may include a memory 510, a timer 520, a compensation amount calculation part 530, a lookup table 540, a data aggregation part 550, and an image data compensation part 560.

The memory 510 may store an initially set luminance value in accordance with an accumulated emission time.

The digital driving method is applied according to an embodiment, and thus the driving currents $I_{OLED}$ flowing into each of the second OLEDs of the plurality of pixels PX may be consistent with each other in magnitude regardless of the image data DR, DG, DB. The timer 520 may measure an accumulated time of light emission of the first OLED of the dummy pixel 220 so as to transmit the measured accumulated time of light emission to the compensation amount calculation part 530.

The compensation amount calculation part 530 may calculate a compensation amount of the image data DR, DG, DB according to the accumulated time of light emission of the first OLED utilizing measured luminance values of the dummy pixel 220 and the accumulated emission time.

The compensation amount calculation part 530 may store the calculated compensation amount in the lookup table 540 in accordance with the accumulated emission time.

For example, the compensation amount calculation part 530 may receive the luminance values of the dummy pixel 220 measured by the light sensor unit 400 and the luminance value initially set in the memory 510. The compensation amount calculation part 530 may calculate an amount of luminance reduction by comparing the measured luminance value with the initially set luminance value. The amount of luminance reduction refers to the difference between a value of luminance occurring when a predetermined driving current $I_{OLED}$ flows into the first OLED and the initially set luminance value.

The compensation amount calculation part 530 may calculate an increased amount of the accumulated emission time of the first OLED so as to generate a compensation amount so as to compensate for the amount of luminance reduction of the first OLED. A relation between the amount of luminance reduction of the first OLED and the increase amount of the accumulated emission time of the first OLED corresponding thereto may be represented by a function F(t) based on experimental data.

In this embodiment, the function F(t) may represent an increased amount of a pulse width of a data voltage corresponding to the image data DR, DG, DB that compensates for the amount of luminance reduction according to the accumulated emission time. In the case where an increased amount of an applying time of the data voltage that compensates for the amount of luminance reduction is proportional to the amount of luminance reduction, the function F(t) may be a relation in which the applying time of the data voltage corresponding to the image data DR, DG, DB increases by 0.1% when an emission time of the first OLED is 20 hours and the amount of luminance reduction is 0.1%. That is, the function F(t) may calculate the increased amount of the applying time of the data voltage, namely the compensation amount, in order to maintain luminance of a specific gray level of the image data DR, DG, DB.

The data aggregation part 550 may receive the image data DR, DG, DB and may accumulate the image data DR, DG, DB of each pixel PX so as to obtain the sum thereof. The image data DR, DG, DB accumulated and added up for each pixel PX may be information corresponding to an accumulated emission time of each pixel PX and the data aggregation part 550 may generate the information about the accumulated emission time corresponding to the image data DR, DG, DB accumulated and added up for each pixel PX.

The image data compensation part 560 may detect an accumulated emission time of each of the second OLEDs of the plurality of pixels PX, detect a compensation amount from the lookup table 540 in accordance with the accumulated emission time, and modulate the image data DR, DG, DB of the second OLED according to the detected compensation amount. The image data compensation part 560 may re-detect the compensation amount every time the compensation unit time elapses, so as to modulate the image data DR, DG, DB.

Consequently, the compensation image data generator 50 may control the whole luminance of the display area 111 to remain unchanged. Therefore, image sticking may be reduced and pixel degradation may be compensated.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims, and equivalents thereof.

What is claimed is:

1. A display device comprising:
   a first substrate;
   a pixel defining layer on the first substrate, the pixel defining layer being configured to define a pixel area;

a pixel electrode in the pixel area;
a light emission layer on the pixel electrode;
a common electrode on the light emission layer;
a second substrate facing the first substrate;
an edge black matrix on one surface of the second substrate, the edge black matrix being configured to define a non-display area;
a reflective layer on the edge black matrix;
a light guide part on one surface of the first substrate; and
a light sensor unit configured to receive light emitted from the light guide part,
wherein the reflective layer is configured to reflect at least some light emitted from the pixel area toward the light guide part.

2. The display device as claimed in claim 1, wherein at least part of the pixel area overlaps the edge black matrix.

3. The display device as claimed in claim 1, wherein the light guide part comprises:
a light guide plate; and
a light guide reflective plate on one surface of the light guide plate.

4. The display device as claimed in claim 3, wherein the light guide plate is at the edge black matrix.

5. The display device as claimed in claim 3, further comprising a prism part between the light guide plate and the first substrate.

6. The display device as claimed in claim 5, wherein the prism part overlaps the edge black matrix.

7. The display device as claimed in claim 5, wherein the prism part overlaps the light guide part.

8. The display device as claimed in claim 5, wherein the light guide plate faces a peak of the prism part.

9. A display device comprising:
a first substrate;
a pixel defining layer on the first substrate, the pixel defining layer being configured to define a pixel area;
a pixel electrode in the pixel area;
a light emission layer on the pixel electrode;
a common electrode on the light emission layer;
a second substrate facing the first substrate;
an edge black matrix on one surface of the second substrate, the edge black matrix being configured to define a non-display area;
a reflective layer on the edge black matrix;
a light guide part on one surface of the first substrate; and
a light sensor unit configured to receive light emitted from the light guide part,
wherein the reflective layer overlaps the light guide part.

10. A display device comprising:
a first substrate;
a pixel defining layer on the first substrate, the pixel defining layer being configured to define a pixel area;
a pixel electrode in the pixel area;
a light emission layer on the pixel electrode;
a common electrode on the light emission layer;
a second substrate facing the first substrate;
an edge black matrix on one surface of the second substrate, the edge black matrix being configured to define a non-display area;
a reflective layer on the edge black matrix;
a light guide part on one surface of the first substrate; and
a light sensor unit configured to receive light emitted from the light guide part,
wherein the reflective layer is at the pixel area overlapping the edge black matrix.

11. The display device as claimed in claim 1, wherein the non-display area includes a pixel that has a same structure as a pixel of a display area.

12. The display device as claimed in claim 1, wherein the light guide part has a polygonal or U-shaped cross-section.

13. The display device as claimed in claim 2, wherein the light sensor unit is configured to measure a luminance value of a pixel disposed in the pixel area overlapping the edge black matrix.

14. The display device as claimed in claim 13, further comprising a compensation image data generator configured to calculate a compensation amount according to an accumulated time of light emission of a first organic light emitting diode at the pixel area overlapping the edge black matrix utilizing the measured luminance value, to detect the compensation amount corresponding to an accumulated time of light emission of a second organic light emitting diode at a display area, and to compensate for image data of the second organic light emitting diode according to the detected compensation amount.

15. The display device as claimed in claim 14, wherein the compensation image data generator comprises:
a memory configured to store an initially set luminance value;
a timer configured to measure an accumulated time of light emission of the first organic light emitting diode;
a data aggregation part configured to accumulate and aggregate the image data corresponding to the second organic light emitting diode disposed in the display area;
a compensation amount calculation part configured to calculate a compensation amount of the image data corresponding to the second organic light emitting diode according to an accumulated time of light emission utilizing the measured luminance value, the initially set luminance value, and the accumulated time of light emission of the first organic light emitting diode; and
an image data compensation part configured to detect the accumulated time of light emission of the second organic light emitting diode, and to modulate the image data of the second organic light emitting diode to the compensation amount corresponding to the detected accumulated time of light emission.

16. The display device as claimed in claim 15, wherein the compensation amount calculation part is configured to calculate a reduction amount of luminance using the measured luminance value and the initially set luminance value and to calculate an increased amount of an accumulated time of light emission corresponding to the calculated reduction amount of luminance to the compensation amount.

17. The display device as claimed in claim 15, wherein the compensation image data generator further comprises:
a lookup table in which the compensation amount calculated by the compensation amount calculation part is stored according to the accumulated time of light emission of the first organic light emitting diode.

* * * * *